United States Patent [19]
Gardner et al.

[11] Patent Number: 5,912,493
[45] Date of Patent: Jun. 15, 1999

[54] ENHANCED OXIDATION FOR SPACER FORMATION INTEGRATED WITH LDD IMPLANTATION

[76] Inventors: Mark I. Gardner, P.O. Box 249, Cedar Creek, Tex. 78612; Fred N. Hause, 4702 Circle Oak La., Austin, Tex. 78749; Charles E. May, 10503 Ames La., Austin, Tex. 78739

[21] Appl. No.: 08/970,263

[22] Filed: Nov. 14, 1997

[51] Int. Cl.⁶ .......................... H01L 29/76; H01L 29/94; H01L 31/062; H01L 31/113
[52] U.S. Cl. ............................................ 257/344; 257/346
[58] Field of Search ...................................... 257/396, 346

[56] References Cited

U.S. PATENT DOCUMENTS

4,928,163  5/1990  Yoshida et al. .

*Primary Examiner*—Stephen D. Meier

[57] ABSTRACT

A method for forming a semiconductor device to produce graded doping in the source region and the drain region includes the steps of forming a gate on the surface of the substrate separated from the substrate by a gate oxide, and applying a first ion implantation to implant lightly doped source and drain regions into the substrate, and implanting a material to a portion of the gate oxide over the source region and a portion of the gate oxide over the drain region to vary the rate of oxide formation. An oxide layer is then formed. The resulting oxide layer has at least two thicknesses. Another ion implantation is applied through the formed oxide layer. The ion implantation converts a portion of the lightly doped source region into a heavily doped source region, and converts a portion of the lightly doped drain region into a heavily doped drain region. The implanted ions travel a set distance through the oxide layer formed and into the substrate and more specifically into the source and drain regions formed in the substrate. Therefore, the geometry of the interface between the lightly doped region and the heavily doped region in the source region and the drain region depends on the geometry (thickness and pattern) of oxide layer formed. A set of spacers can also be added after lightly doping the substrate to form the Ldd source and Ldd drain. The geometry of the spacers will also then effect the geometry of the interface between the lightly doped and heavily doped regions within the source and the drain. Also disclosed is a device made by this process as well as an information handling system including such a device.

11 Claims, 7 Drawing Sheets

ENHANCED OXIDATION FOR SPACER FORMATION INTEGRATED WITH LDD IMPLANTATION

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or Ldd) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Including a heavily doped portion and a lightly doped portion in a source or drain is referred to as having graded doping within the source and drain. MOSFETs without graded doping generally have a shortened life which is well below the industry-wide design point of a 10-year life. To extend the life of an IGFET, a drain with a graded, or lightly doped extension is produced. Due to processing steps, a graded source is also produced. Qualitatively, $\epsilon_{ymax}$ is reduced by such a graded or lightly doped extension or buffer region because the maximum electric field in a reverse-biased pn junction is highest when the junction is abrupt. By replacing the abrupt drain doping profile of a conventional IGFET with a drain that has a more gradually decreasing lateral doping profile (i.e., a graded drain), the voltage drop becomes shared by the drain and the channel, in contrast to an abrupt $n^+/p$ drain junction, in which almost the entire voltage drop occurs across the lightly doped (channel) side of the junction. The model equation for $\epsilon_{ymax}$ is provided below:

$$\epsilon_{ymax} = (V_{DS} - V_{DSsat})/l \qquad \text{(Equation 1)}$$

where, $\epsilon_{ymax}$ is the maximum channel electric field, l is the channel length, $V_{DS}$ is the voltage across the channel, and $V_{DSsat}$ is the voltage across the channel at saturation. $\epsilon_{ymax}$ is significantly reduced by the presence of such a lightly doped region because this is another way to increase the denominator of Equation 1.

Graded-drain regions can be created in IGFETs in a number of ways, including: (1) using phosphorus in place of As as the dopant of the source/drain regions; (2) adding fast diffusing phosphorus to an As-doped drain region, and driving the phosphorus laterally ahead of the arsenic with a high temperature diffusion step to create a double-diffused drain [DDD] structure; and (c) pulling the highly doped ($n^+$) drain region away from the gate edge with an "oxide spacer" to create a lightly doped drain (LDD) structure.

SUMMARY OF THE INVENTION

A method for forming a semiconductor device to produce graded doping in the source region and the drain region includes the step of forming a gate on the surface of the substrate separated from the substrate by a gate oxide. The gate oxide layer remains across the surface of the substrate. A first ion implantation is applied through the gate oxide layer to implant lightly doped source and drain regions into the substrate. A material is also applied or implanted to a portion of the gate oxide over the source region and a portion of the gate oxide over the drain region to vary the rate of oxide formation. An additional oxide layer is then grown or formed on the existing gate oxide. Since the oxide now grows at two different rates, the resulting oxide layer has at least two thicknesses. Another ion implantation is applied through the formed oxide layer. The ion implantation converts a portion of the lightly doped source region into a heavily doped source region, and converts a portion of the lightly doped drain region into a heavily doped drain region. The implanted ions travel a set distance through the oxide layer formed and into the substrate and more specifically, into the source and drain regions formed in the substrate. Therefore, the geometry of the interface between the lightly doped region and the heavily doped region in the source region and the drain region depends on the geometry (thickness and pattern) of oxide layer formed. A set of spacers can also be added after lightly doping the substrate to form the Ldd source and Ldd drain. The geometry of the spacers will also then effect the geometry of the interface between the lightly doped and heavily doped regions within the source and the drain.

Advantageously, the thickness and position of the oxide layer can be varied to form a graded channel having a different geometry. The steps are easily performed and one implantation for heavy doping is all that is needed to form the graded junction or doping pattern. The resulting device has a longer life, is more reliable and less likely to fail than devices without graded doped drains and sources. In addition, the geometry of the doping profile can be controlled more precisely using this invention. Information handling systems including such a device are also more reliable and long lived.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
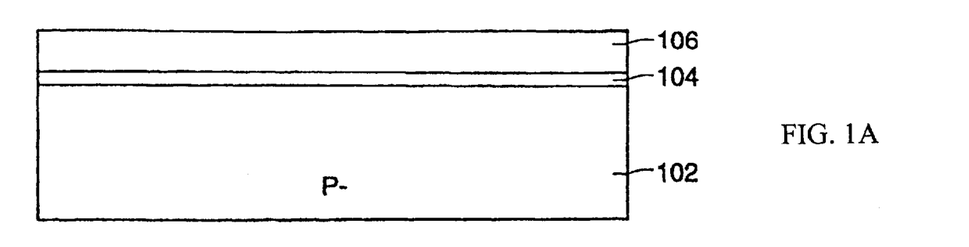
FIGS. 1A–1H show cross-sectional views of successive process steps for making an IGFET with graded doping in the drain region and source region in accordance with an embodiment of the invention.

Described first is an NMOSFET transistor. In FIG. 1A, silicon substrate 102 suitable for integrated circuit manufacture includes P-type epitaxial layer with a boron background concentration on the order of $1\times10^{16}$ atoms/cm$^3$, a <100> orientation and a resistivity of 12 ohm-cm. Preferably, the epitaxial surface layer is disposed on a P+ base layer (not shown) and includes a planar top surface. Gate oxide 104, composed of silicon dioxide ($SiO_2$), is formed on the top surface of substrate 102 using oxide tube growth at a temperature of 700° to 1000° C. in an $O_2$ containing ambient. A typical oxidation tube contains several sets of electronically powered heating coils surrounding the tube, which is either quartz, silicon carbide, or silicon. In $O_2$ gas oxidation, the wafers are placed in the tube in a quartz "boat" or "elephant" and the gas flow is directed across the wafer surfaces to the opposite or exhaust end of the tube. Gate oxide 104 has a thickness of 25–50 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 106 be doped during an implantation step following a subsequent etch step.

Figure 1B:
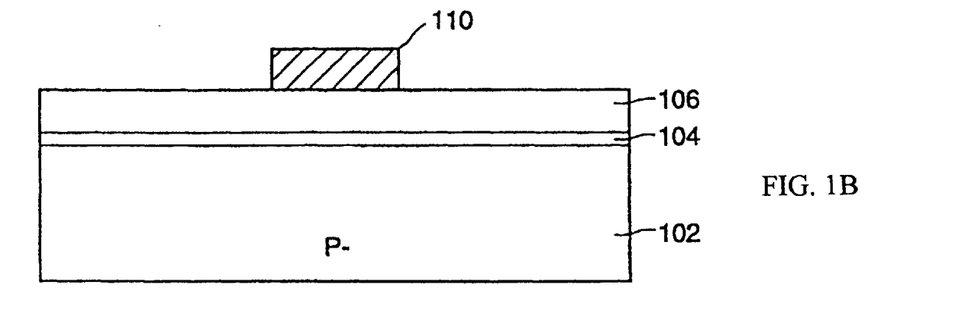

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
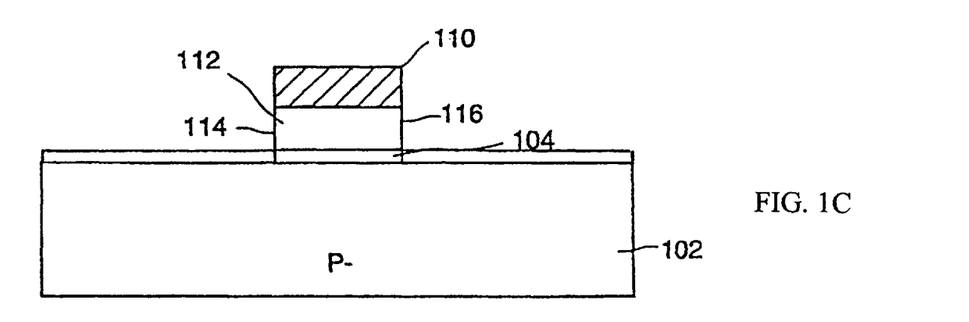

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is left on the surface of the silicon substrate 102 and has a thickness in the range of 30–60 angstroms. Typically, the gate oxide 104 is placed on the surface of the silicon substrate 102 at the selected thickness in the range of 30–60 angstroms. Although unlikely, a second dry or plasma etch may be applied that is highly selective of silicon dioxide (the typical gate material), using the remaining photoresist 110 as an etch mask to thin the layer of the gate oxide 104 to a selected thickness. After the etching step or steps, a gate oxide layer of 30–60 angstroms remains atop the surface of the silicon substrate, and the remaining portion of the polysilicon 106 provides polysilicon gate 112 with opposing vertical sidewalls 114 and 116. Polysilicon gate 112 has a length (between sidewalls 114 and 116) of 3500 angstroms.

Figure 1D:
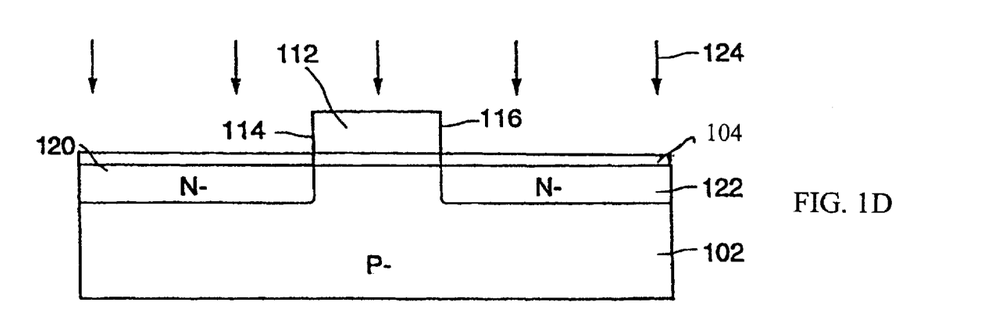

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. The ion implantation of phosphorus is done through the layer of gate oxide 104. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N− with a phosphorus concentration in the range of about $1\times10^{17}$ to $5\times10^{18}$ atoms/cm$^3$.

Figure 1E:
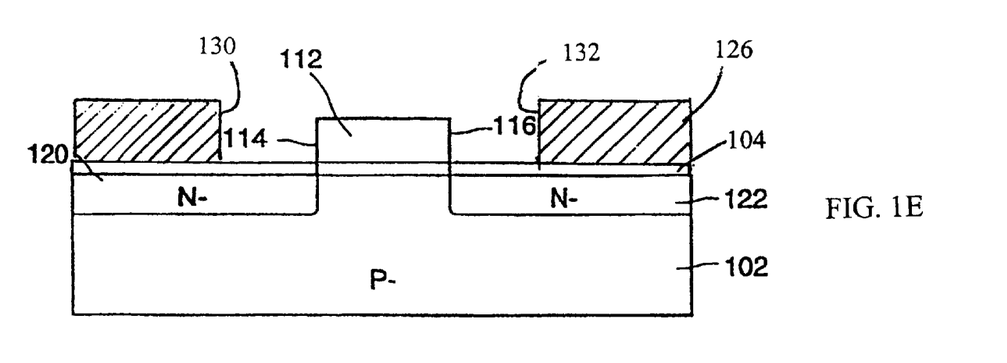

In FIG. 1E, photoresist 126 is deposited as a continuous layer over substrate 102 and selectively irradiated using the photolithographic system and a second reticle to obtain a second image pattern, and the irradiated portions are removed to provide a first opening 130 and a second opening 132 in the photoresist 126. The first opening 130 exposes a portion of the lightly doped source region 120. The second opening exposes a portion of the lightly doped drain region 122. The exposed portion of the lightly doped source region 120 is adjacent the sidewall 114 of the polysilicon gate 112. The exposed portion of the lightly doped drain region 122 is adjacent to sidewall 116 of the polysilicon gate 112.

Figure 1F:
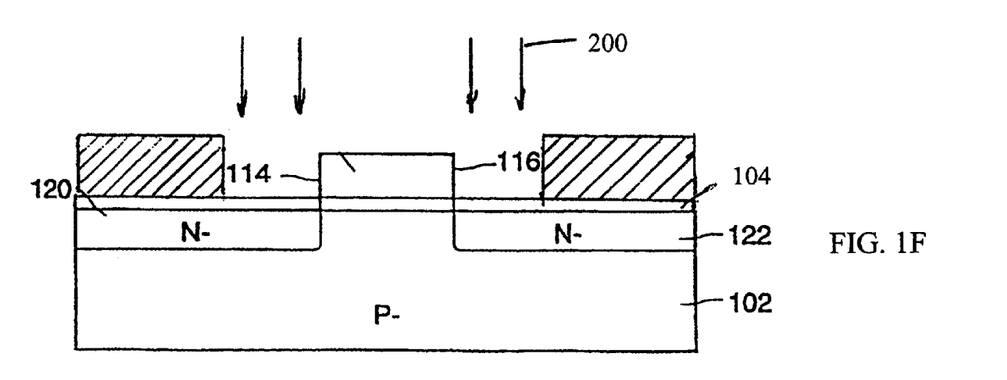

The next step, shown in FIG. 1F, is to provide another arsenic implant as indicated by the arrows 200. The mask resulting from the remaining photoresist and the polysilicon gate 112 allows the arsenic dopant to only be implanted adjacent the gate electrode edge on both sides of the polysilicon gate 112. The ion implantation of arsenic is at a dose in the range of $2 \times 10^{14}$ to $2 \times 10^{15}$ ions/cm$^2$ and at an energy level in the range of 5 to 20 kiloelectron-volts. The arsenic is implanted into the gate oxide 104. Some of the dopant from the first arsenic implant may also travel into the lightly doped source 120 and the lightly doped drain 122. Upon completion of the first arsenic implant, the remaining photoresist is removed.

Figure 1G:
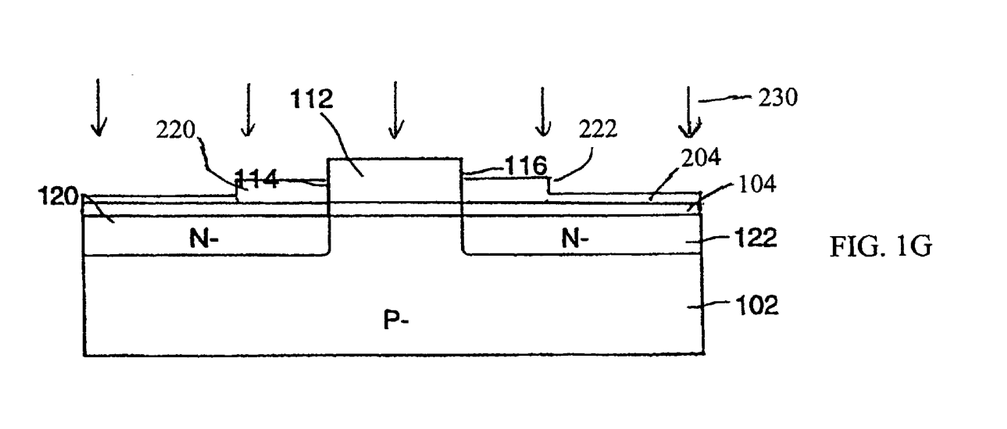

As shown in FIG. 1G, an oxide layer is grown on the resulting structure. The oxide layer 204, composed of silicon dioxide (SiO$_2$), is formed on the top surface of substrate 102 using oxide tube growth at a temperature of 700° to 1000° C. in an O$_2$ containing ambient. The oxide layer can also be formed using rapid thermal annealing (RTA). RTA has several advantages over the use of an oxide tube, including less warpage of the wafers and localized heating.

The resulting oxide layer 204 is not uniform. An implant of arsenic in a material will enhance the oxidation rate. In other words, the oxide layer 204 will grow faster in a material that is doped with arsenic when compared to a material not doped with arsenic. The rate of oxidation is in an arsenic implanted region is enhanced at a ratio in the range of 4:1 to 8:1 when compared to the rate of oxidation in a non-implanted arsenic region. As a result, the portion of the lightly doped source 120 and the portion of the lightly doped drain 122 previously doped with arsenic implanted during the first arsenic implantation step will form a thicker oxide layer while being thermally treated to produce the oxide layer 204. The oxide layer 204 is comprised of a step 220 adjacent the sidewall 114 and a step 222 adjacent the sidewall 116. The thickness of the steps 220 and 222 is approximately 400 angstroms. The thickness of the remaining layer of oxide is 50–100 angstroms. It should be noted that although the steps are shown with square corners, in practice the corners are more rounded.

In FIG. 1G, lightly doped source region 120 is converted into heavily doped source region 128 by subjecting the structure to ion implantation of arsenic, indicated by arrows 230, at a dose in the range of $2 \times 10^{15}$ to $5 \times 10^{15}$ atoms/cm$^2$ and an energy in the range of 10 to 80 kiloelectron-volts. The polysilicon gate 112 provides an implant mask for the underlying portion of substrate 102. The oxide layer 104 and the oxide layer 204 with the steps 220 and 222 also act as a partial mask or serve to absorb a portion of the implanted ions since the ions are drive to a specific depth.

Figure 1H:
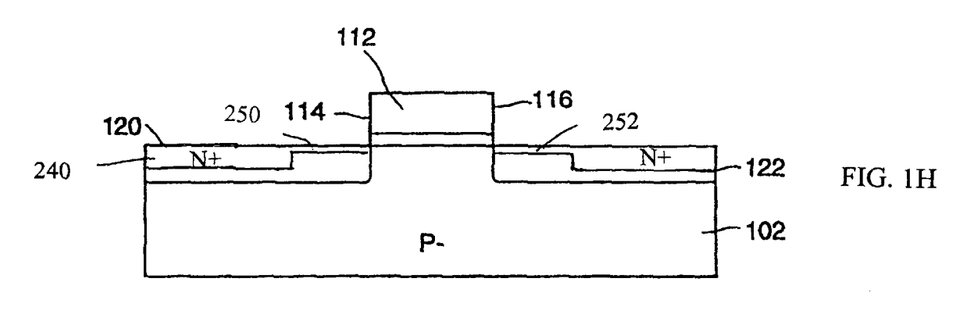

The result is a graded dope drain and source having a heavily doped source region 240 with a cross section such as is shown in FIG 1H. The heavily doped source region 240 includes a first shallow portion 250 having one end aligned with the side wall 114 and a second shallow portion 252 aligned with the side wall 116. Portions of the source 120 and the drain 122 remain lightly doped. Heavily doped source region 240 is doped N+ with an arsenic concentration in the range of about $1 \times 10^{19}$ to $5 \times 10^{20}$ atoms/cm$^3$. Preferably, the dopant concentration of heavily doped source region 240 is at least 10 times that of lightly doped drain region 122. As shown in FIG. 1 H, the gate oxide 104 and the oxide layer 204 have been etched away using a dry or plasma etch. The result is a source 120 and a drain 122 having heavily doped areas as shown. Thus the invention uses the fact that an oxidation layer on the surface forms at a different rates depending on the dopant placed on the surface and incorporates this as a step in the process of forming a graded doped region in the source and drain. Advantageously, one ion implantation step can be used to form a heavily doped region having ions implanted to different depths to form a desired geometry.

The remaining steps include annealing the structure as shown in FIG. 1H using a rapid thermal anneal process. The annealing redevelops the crystalline structure of the doped regions. A rapid thermal anneal on the order of 900° to 1050° C. for 10 to 30 seconds is applied to remove crystalline damage and to drive-in and activate the implanted dopants. As a result, heavily doped source region 128 and ultra-heavily doped source region 136 merge to form a source, and lightly doped drain region 122 and heavily doped drain region 138 merge to form a drain for an MOS device controlled by polysilicon gate 112. Since the dopants diffuse both vertically and laterally during the anneal, heavily doped source region 128 and lightly doped drain region 122 extend slightly beneath sidewalls 114 and 116, respectively, and ultra-heavily doped source region 136 and heavily doped drain region 138 extend slightly beneath oxide spacers 132 and 134, respectively. As is seen, heavily doped source region 128 provides a first channel junction 142 that is substantially aligned with sidewall 114, and lightly doped drain region 122 provides a second channel junction 144 that is substantially aligned with sidewall 116. In addition, ultra-heavily doped source region 136 and heavily doped drain region 138 are spaced from channel junctions 142 and 144.

One of the final steps includes salicidation. Spacers are formed on the sidewalls 114 and 116 of the gate. A blanket layer of silicon dioxide with a thickness of 2500 angstroms is conformably deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend 200–1200 angstroms across substrate 102.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. In addition to the formation of spacers on the gate, salicidation includes depositing a metal layer over the entire resulting surface and reacting the metal to form a salicide on top of the gate 112, on the top of the source 120 and on the top of the drain 122. Unreacted metal is then removed, glass is placed over the surface and a contact opening is formed for connectors. The device formed appears as shown in FIG. 1I. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. Described above is an N-type channel. Various flows and energies could be used to produce a suitable N-type channel. Suitable N-type dopants include arsenic, phosphorus and combinations thereof.

Figure 2A:
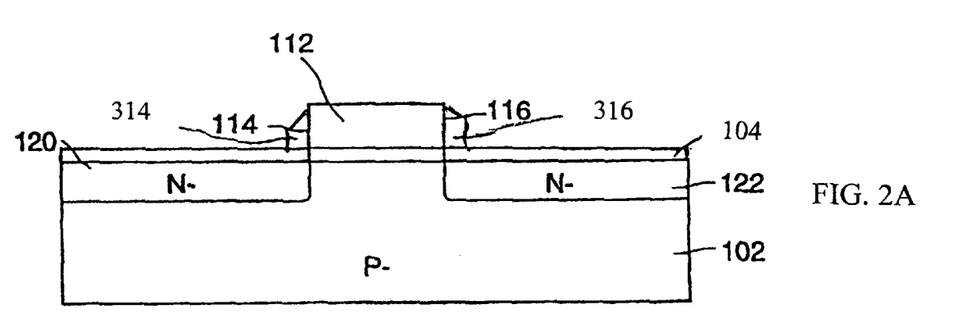
FIGS. 2A–2E show cross-sectional views of successive process steps for making an IGFET with graded doping in the drain region and source region in accordance with an embodiment of the invention.

FIGS. 2A–2E show cross-sectional views of successive process steps for making an IGFET with graded doping in the drain region and source region in accordance with another embodiment of the invention. The initial process steps shown in FIGS 1A–1D are the same. Accordingly, FIG. 2A is shows the step after the steps depicted previously in FIGS. 1A–1D. After forming the lightly doped source 120 and lightly doped drain 122, a first nitride spacer 314 and a second nitride spacer 316 are formed on the sidewalls 114 and 116, respectively of the gate 112. The nitride spacers are on the order of 30–200 angstroms in thickness.

Figure 2B:
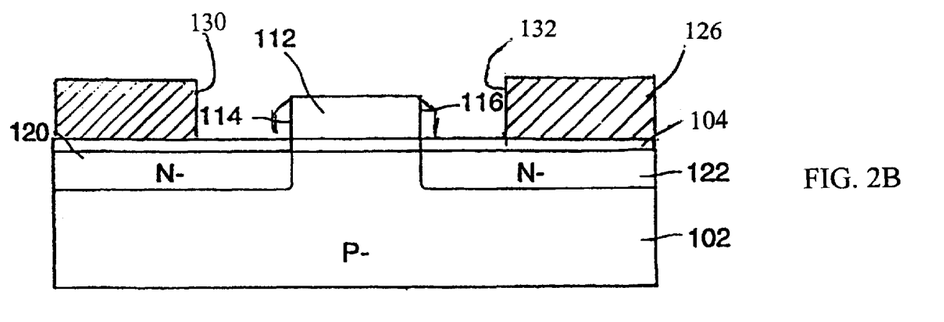

In FIG. 2B, photoresist 126 is deposited as a continuous layer over substrate 102 and selectively irradiated using the photolithographic system and a second reticle to obtain a second image pattern, and the irradiated portions are removed to provide a first opening 130 and a second opening 132 in the photoresist 126. The first opening 130 exposes a portion of the lightly doped source region 120. The second opening exposes a portion of the lightly doped drain region 122. The exposed portion of the lightly doped source region 120 is adjacent the sidewall 114 of the polysilicon gate 112. The exposed portion of the lightly doped drain region 122 is adjacent to sidewall 116 of the polysilicon gate 112. This process step corresponds to the process step previously shown in FIG. 1E.

Figure 2C:
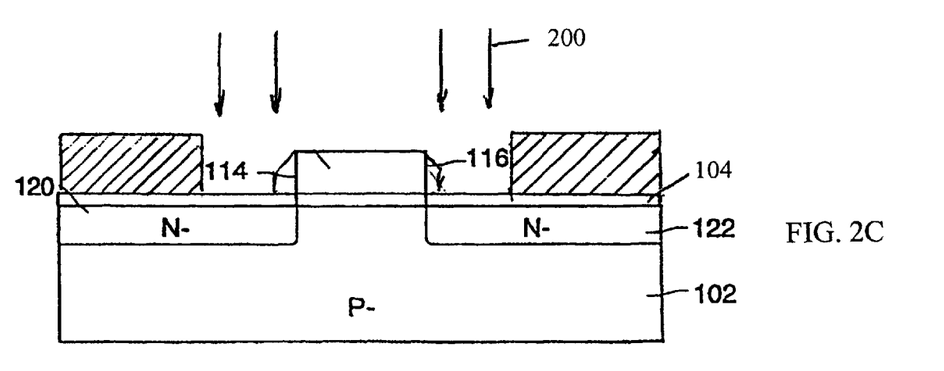

The next step, shown in FIG. 2C, is to provide another arsenic implant as indicated by the arrows 200. The implant dosage ranges from $2 \times 10^{14}$ to $2 \times 10^{15}$ ions/cm$^2$. The implant energy is from 5 to 20 kiloelectron-volts. The mask resulting from the remaining photoresist and the polysilicon gate 112 allows the arsenic dopant to only be implanted adjacent the gate electrode edge on both sides of the polysilicon gate 112, and more specifically along side the spacers 314 and 316. The arsenic is implanted into the gate oxide 104. Some arsenic is also implanted into the nitride spacers 314 and 316. Some of the dopant from the first arsenic implant may also travel into the lightly doped source 120 and the lightly doped drain 122. Upon completion of this arsenic implant, the remaining photoresist is removed.

Figure 2D:
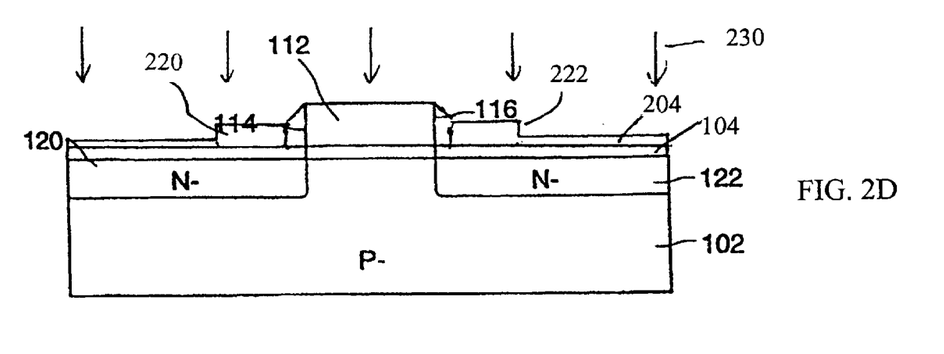

As shown in FIG. 2D, an oxide layer is grown on the resulting structure. It should be noted the oxide layers grow at different rates, depending on the concentration of arsenic. The shape of the nitride spacer stays the same and the nitride is impervious to oxide growth. The oxide layer 204, composed of silicon dioxide (SiO$_2$), is formed on the top surface of substrate 102 using oxide tube growth at a temperature of 700° to 1000° C. in an O$_2$ containing ambient. The oxide layer can also be formed using rapid thermal annealing (RTA). RTA has several advantages over the use of an oxide tube, including less warpage of the wafers and localized heating.

The resulting oxide layer 204 is not uniform. An implant of arsenic in a material will enhance the oxidation rate. In other words, the oxide layer 204 will grow faster in a material that is doped with arsenic when compared to a material not doped with arsenic. The rate of oxidation is in an arsenic implanted region is enhanced at a ratio in the range of 4:1 to 8:1 when compared to the rate of oxidation in a non-implanted arsenic region. As a result, the portion of the lightly doped source 120 and the portion of the lightly doped drain 122 previously doped with arsenic implanted during the first arsenic implantation step will form a thicker oxide layer while being thermally treated to produce the oxide layer 204. The oxide layer 204 is comprised of a step 220 adjacent the sidewall 114 and a step 222 adjacent the sidewall 116. The thickness of the steps 220 and 222 is approximately 400 angstroms. The thickness of the remaining layer of oxide, previously under the mask during the preceding step is 50–100 angstroms.

In FIG. 2D, lightly doped source region 120 and the lightly doped drain 122 are provided with a heavily doped source and drain region 240 by subjecting the structure to ion implantation of arsenic, indicated by arrows 230, at a dose of in the range of $2 \times 10^{15}$ to $5 \times 10^{15}$ atoms/cm$^2$ and an energy in the range of 10 to 80 kiloelectron-volts. The polysilicon gate 112 provides an implant mask for the underlying portion of substrate 102. The oxide layer 104, the oxide layer 204 with the steps 220 and 222, and the nitride spacers 314 and 316 also act as a partial mask or serve to absorb a portion of the implanted ions since the ions are driven to a specific depth.

Figure 2E:
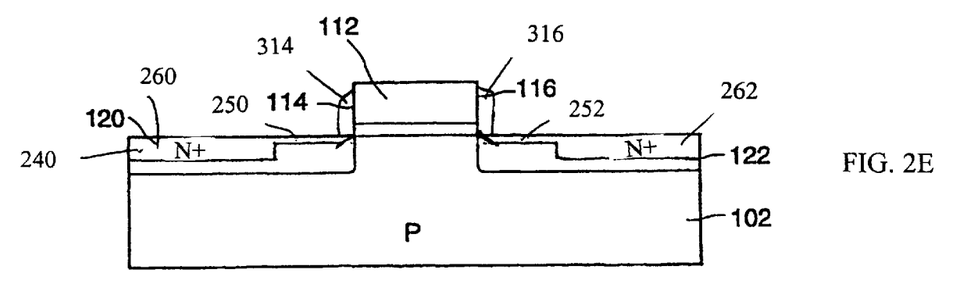

The result is a graded dope drain and source having a heavily doped source region 240 with a cross section such as is shown in FIG. 2E. The heavily doped source region 240 includes a first triangularly-shaped portion 350 located beneath the spacer 314, a second triangularly-shaped portion 352 located beneath the spacer 316, a first shallow portion 250 having one end aligned with the side wall of the spacer 314, a second shallow portion 252 aligned with the side wall of the spacer 316, a first rectangular portion 260, and a second rectangular portion 262. Portions of the source 120 and the drain 122 remain lightly doped. Heavily doped source region 240 is doped N+ with an arsenic concentration in the range of about $1 \times 10^{19}$ to $5 \times 10^{20}$ atoms/cm$^3$. Preferably, the dopant concentration of heavily doped source region 240 is at least 10 times that of lightly doped drain region 122. As shown in FIG. 2E, the gate oxide 104 and the oxide layer 204 have been etched away using a dry or plasma etch. The result is a source 120 and a drain 122 having heavily doped areas as shown. Thus the invention uses the fact that an oxidation layer on the surface is forms at a different rates depending on the dopant placed on the surface and incorporates this as a step in the process of forming a graded doped region in the source and drain. Advantageously, one ion implantation step can be used to form a heavily doped region having ions implanted to different depths to form a desired geometry.

The present invention includes numerous variations to the embodiment described above. For instance, the gate insulator and spacers and can be various dielectrics including silicon dioxide, silicon nitride and silicon oxynitride. Described above is an N-type channel. Various flows and energies could be used to produce a suitable N-type channel. Suitable N-type dopants include arsenic, phosphorus and combinations thereof.

Figure 3:
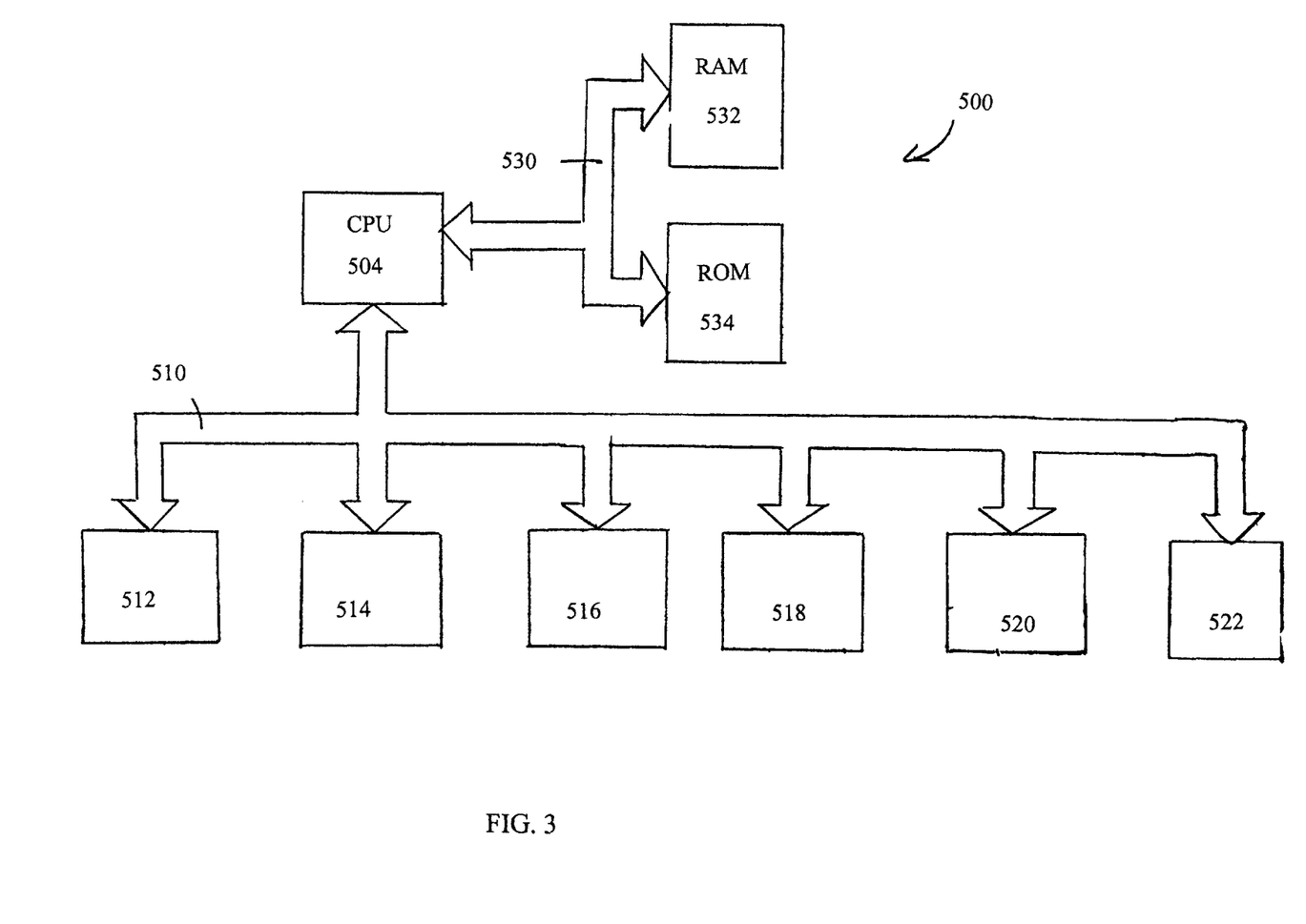
FIG. 3 is a schematic of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 510, a random access memory 520, and a system bus 530 for communicatively coupling the central processing unit 510 and the random access memory 520. The system 500 also includes an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The information handling system 500 includes a device such as is shown in FIG. 2E or in FIG. 1H. The graded doping region in the device provides for a fast and reliable channel having a long life. Faster channels are needed as clocking speeds for microprocessors climb and the channel must also be reliable and long-lived. The graded doping region can be formed in one ion implant step rather than several. This provides for a much more controlled process.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A device comprising:

a semiconductor substrate;

a layer of gate oxide connected to said semiconductor substrate;

a gate attached to said layer of gate oxide;

a source region having graded levels of doping in the substrate, said source having a lightly doped region and a heavily doped region, the heavily doped region of the source region having a first portion adjacent to the gate and a second portion adjacent to the first portion, the first portion having a first generally uniform depth extending laterally from the gate, and the second portion having a second depth extending laterally from the first portion; and a drain region having graded levels of doping in the substrate, said drain having a lightly doped region and a heavily doped region, the heavily doped region of the drain region having a first portion adjacent to the gate and a second portion adjacent to the first portion, the first portion having a first generally uniform depth extending laterally from the gate, and the second portion having a second depth extending laterally from the first portion, the heavily doped region formed by growing an oxide layer having at least two thicknesses over the source region and over the drain region, and implanting ions through the formed oxide layer to form the heavily doped region of the source and the heavily doped region of the drain.

2. The device of claim 1 wherein the graded levels of doping in the drain and in the source are formed by the addition step of applying a material to a portion of the source region and a portion of the drain region to vary the rate of oxide formation.

3. The device of claim 2 wherein the graded levels of doping in the drain and the graded levels of doping in the source are varied with application of a selected material to a portion of the source region and to a portion of the drain region.

4. The device of claim 2 wherein the graded levels of doping in the drain and the graded levels of doping in the source are varied with application of a selected pattern of a selected material to a portion of the source region and to a portion of the drain region.

5. The device of claim 2 wherein the graded levels of doping in the drain and in the source are varied by the addition step of implanting ions to a portion of the source region and to a portion of the drain region to vary the rate of oxide formation over the source region and the drain region.

6. The device of claim 1, wherein the first depths of the heavily doped regions are less than the second depths of the heavily doped regions.

7. The device of claim 1, wherein the heavily doped regions have a dopant concentration that is approximately 10-times the dopant concentration of the lightly doped regions.

8. An information handling system comprising:

a central processing unit;

a random access memory; and a system bus for communicatively coupling the central processing unit and the random access memory, said information handling system further including a device further comprising:

a semiconductor substrate;

a layer of gate oxide connected to said semiconductor substrate;

a gate attached to said layer of gate oxide;

a source region having graded levels of doping in the substrate, said source having a lightly doped region and a heavily doped region, the heavily doped region of the source region having a first portion adjacent to the gate and a second portion adjacent to the first portion, the first portion having a first generally uniform depth extending laterally from the gate, and the second portion having a second depth extending laterally from the first portion; and a drain region having graded levels of doping in the substrate, said drain having a lightly doped region and a heavily doped region, the heavily doped region of the drain region having a first portion adjacent to the gate and a second portion adjacent to the first portion, the first portion having a first generally uniform depth extending laterally from the gate, and the second portion having a second depth extending laterally from the first portion, the heavily doped region formed by growing an oxide layer having at least two thicknesses over the source region and over the drain region, and implanting ions through the formed oxide layer to form the heavily doped region of the source and the heavily doped region of the drain.

9. The information handling system of claim 8 wherein the graded levels of doping in the drain and in the source are formed by the addition step of applying a selected material to a selected portion of the source region and a to a selected portion of the drain region to vary the rate of oxide formation.

10. The information handling system of claim 8 wherein the graded levels of doping in the drain and the graded levels of doping in the source are varied with application of a selected material to a portion of the source region and to a portion of the drain region.

11. The information handling system of claim 8 wherein the graded levels of doping in the drain and the graded levels of doping in the source are varied with application of a selected pattern of a selected material to a portion of the source region and to a portion of the drain region.

* * * * *

UNITED STATES PATENT AND TRADEMARK OFFICE
CERTIFICATE OF CORRECTION

PATENT NO. : 5,912,493

DATED : June 15, 1999

INVENTOR(S) : GARDNER et al.

It is certified that error appears in the above-identified patent and that said Letters Patent is hereby corrected as shown below:

Col. 10, line 49: "claim 8" should read --claim 9--.

Col. 10, line 54: "claim 8" should read --claim 9--.

Signed and Sealed this

Twelfth Day of December, 2000

Attest:

Attesting Officer

Q. TODD DICKINSON

Director of Patents and Trademarks